(12) United States Patent
Bogatin et al.

(10) Patent No.: US 7,498,826 B2
(45) Date of Patent: Mar. 3, 2009

(54) PROBE ARRAY WAFER

(75) Inventors: Eric L. Bogatin, Olathe, KS (US);
David W. Henry, Platte City, MO (US);
Donald A. Marx, Olathe, KS (US)

(73) Assignee: Interconnect Devices, Inc., Kansas City, KS (US)

( * ) Notice: Subject to any disclaimer, the term of this patent is extended or adjusted under 35 U.S.C. 154(b) by 77 days.

(21) Appl. No.: 11/511,061

(22) Filed: Aug. 25, 2006

(65) Prior Publication Data

US 2008/0068034 A1 Mar. 20, 2008

(51) Int. Cl.
*G01R 31/02* (2006.01)
(52) U.S. Cl. ...................................... 324/754
(58) Field of Classification Search .......... 324/754–765
See application file for complete search history.

(56) References Cited

U.S. PATENT DOCUMENTS

| | | | | |
|---|---|---|---|---|
| 4,352,061 A * | 9/1982 | Matrone | ...................... | 324/754 |
| 4,506,215 A * | 3/1985 | Coughlin | ..................... | 324/761 |
| 4,780,670 A * | 10/1988 | Cherry | ....................... | 324/754 |
| 4,833,402 A * | 5/1989 | Boegh-Petersen | ........... | 324/754 |
| 4,862,075 A * | 8/1989 | Choi et al. | ................... | 324/753 |
| 4,931,726 A * | 6/1990 | Kasukabe et al. | ........... | 324/754 |
| 4,993,968 A | 2/1991 | Guletsky et al. | | |
| 4,993,969 A | 2/1991 | Cabourne | | |
| 5,134,363 A * | 7/1992 | Lang-Dahlke | .............. | 324/761 |
| 5,160,269 A | 11/1992 | Fox, Jr. et al. | | |
| 5,276,395 A * | 1/1994 | Malloy | ....................... | 324/761 |
| 5,639,385 A * | 6/1997 | McCormick | ................. | 216/14 |
| 5,818,248 A | 10/1998 | St. Onge | | |
| 6,359,452 B1 * | 3/2002 | Mozzetta | .................... | 324/754 |
| 6,570,399 B2 * | 5/2003 | Yeghiayan et al. | .......... | 324/761 |
| 2002/0011860 A1 | 1/2002 | Hamren | | |
| 2004/0022042 A1 | 2/2004 | Mok et al. | | |
| 2004/0043653 A1 | 3/2004 | Feldman | | |
| 2004/0115994 A1 | 6/2004 | Wulff et al. | | |

* cited by examiner

*Primary Examiner*—Ha Tran T Nguyen
*Assistant Examiner*—Joshua Benitez
(74) *Attorney, Agent, or Firm*—Pepper Hamiltton LLP

(57) ABSTRACT

A probe array wafer includes a substrate upon which a plurality of compliant probes are mounted. Pairs of axially aligned probes may be electrically connected together to provide a pass through power connection from the test equipment to the device under test. Likewise, pairs of axially aligned probes may be electrically connected together to provide a ground connection from the test equipment to the device under test.

18 Claims, 3 Drawing Sheets

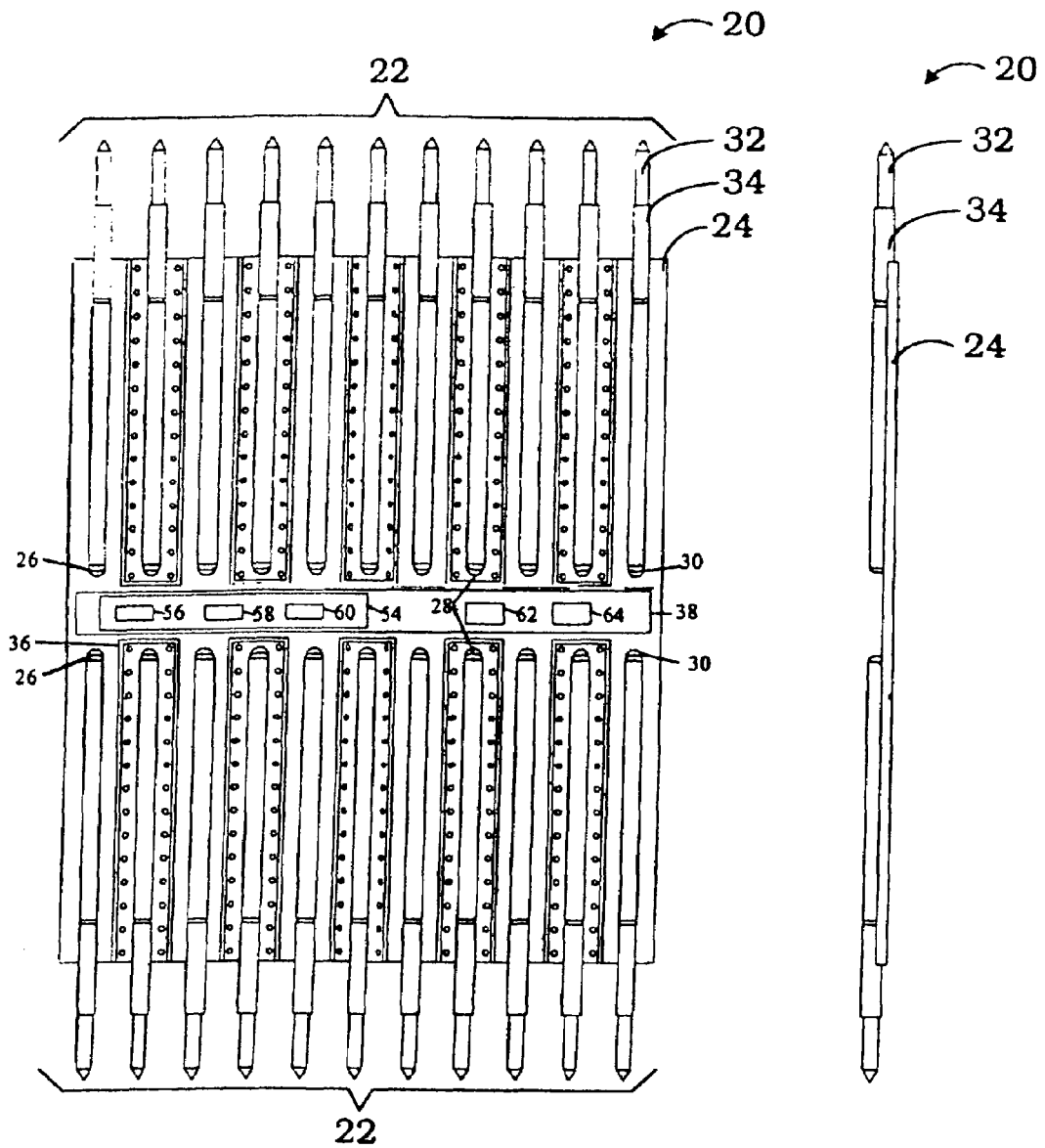
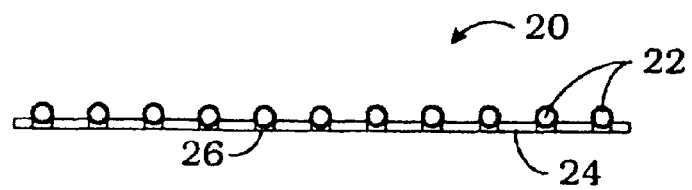
Fig. 1   Fig. 3
Fig. 2

PROBE ARRAY WAFER

FIELD OF THE INVENTION

The present invention relates to compliant probes and, more particularly, to integration of an array of compliant probes into a substrate to connect an array of pads between two circuit boards or electronic assemblies. The substrate enhances the electrical performance of the array of probes.

BACKGROUND

Interconnecting of two separate boards or components has been accomplished by an array of spring test probes installed into receptacles. The probes are press fit into a matrix of holes drilled in a block. The block is mounted to one circuit board with the probes perpendicular to the surface of the board to mate with a device under test or another circuit board to perform functional testing, parametric testing or burn-in testing, for example.

Difficulty in installing the probes in the substrate block and accurate location of the retaining holes increases the cost of producing the block of probes. The blocks are not readily adaptable for more complex applications such as testing with active or passive components coupled to the spring probes. Additionally, the block must fit the application and is therefore not adaptable for other applications not having the same probe pattern or probe number.

SUMMARY

A probe array wafer is provided which includes compliant probes mounted on the edges of an insulating substrate to electrically isolate the probes. The probes are pressed into grooves or slots in the insulating substrate or mounted to the surface of the substrate. For a single layer substrate, pairs of axially aligned probes may be electrically connected together to provide a pass through power connection from the test equipment to the device under test, for example. Likewise, pairs of axially aligned probes may be electrically connected together to provide a ground connection from the test equipment to the device under test. In addition to enabling high quality power distribution, such arrays of probes can also provide high bandwidth signal connections by using controlled impedance circuit board traces between opposing spring probes.

BRIEF DESCRIPTION OF THE DRAWINGS

FIG. 1 is a front elevation view of the probe array wafer of the present invention.

FIG. 2 is an end view of the probe array wafer of FIG. 1.

FIG. 3 is a side view of the probe array wafer of FIG. 1.

DETAILED DESCRIPTION

Figures 4, 5:
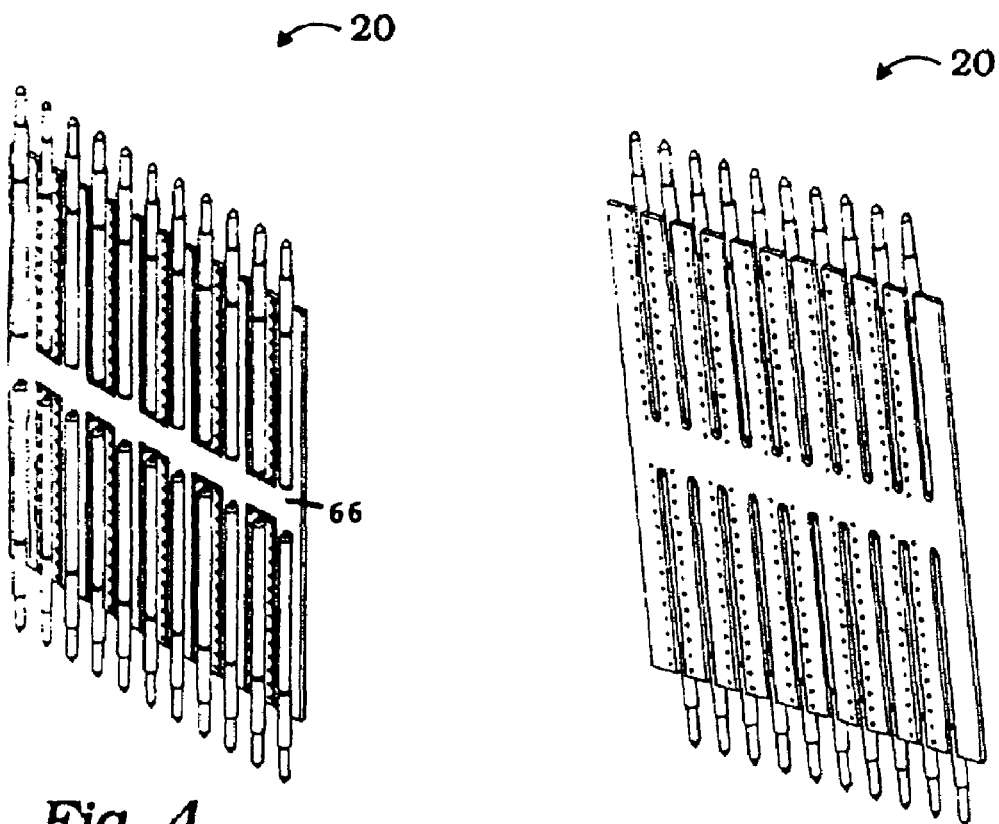
FIG. 4 is a front perspective view of the probe array wafer of FIG. 1.
FIG. 5 is a rear perspective view of the probe array wafer of FIG. 1.

Detailed embodiments of the invention are disclosed herein, however, it is to be understood that the disclosed embodiments are merely exemplary of the invention which may be embodied in various forms. Therefore, specific structural and functional details disclosed herein are not to be interpreted as limiting, but rather merely as a basis for teaching one skilled in the art to variously employ the present invention in any appropriately detailed form, and as a basis for the claims.

Referring to FIGS. 1-5, a probe array wafer is generally indicated by reference numeral 20. Probe array wafer 20 includes spring probes 22 mounted on an insulating substrate 24 to electrically isolate the probe 22. Spring probes 22 may be soldered or pressed into grooves or slots 26 in the insulating substrate 24. For a single layer substrate 24, pairs of axially aligned probes 28 may be electrically connected together to provide a pass through power connection from the test equipment (not shown) to the device under test (DUT) (not shown), for example. Likewise, pairs of axially aligned probes 30 may be electrically connected together to provide a ground connection from the test equipment to the DUT.

All probes 22 are generally coplanar and may be combined in various numbers according to the particular application and DUT. As shown, probes 22 are conventional single-ended compliant probes with a plunger 32 and a barrel 34. A conductive film, solder or plate 36 may be applied around a groove 26 to provide electrical contact all along the barrel 34. An insulating gap provides isolation of a probe from the surface metallization 36 that may connect to other probes.

Figure 6:
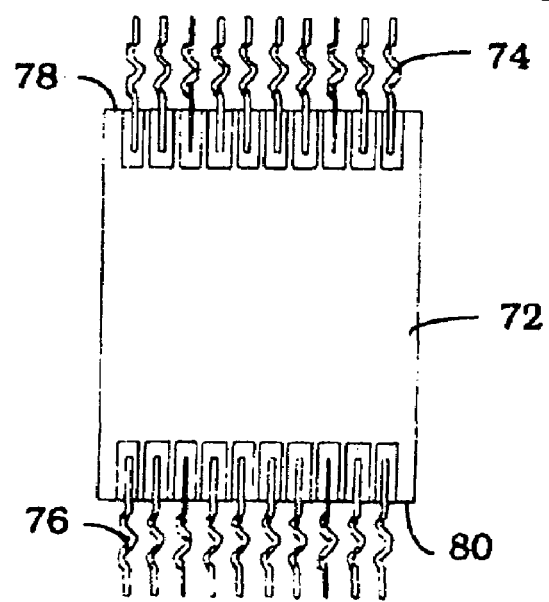
FIG. 6 is a front elevation view of a probe array wafer with another compliant probe member.

Referring to FIG. 6, another probe array wafer is generally indicated by reference numeral 70. Probe array wafer 70 includes an insulating substrate 72 and compliant probe members 74 and 76 extending from opposite edges 78 and 80 of the substrate 72. The compliant members may be bent metal, spring probes or other compliant probe. The probes 74 may be connected to the probes 76 using planes or traces in the circuit board (not shown). A multilayer substrate 66 may be used to provide greater functional performance, such as low loop inductance, decoupling capacitance and controlled impedance signal connections in connecting probes along one edge of the substrate to the probes along the other edge.

Figure 7:
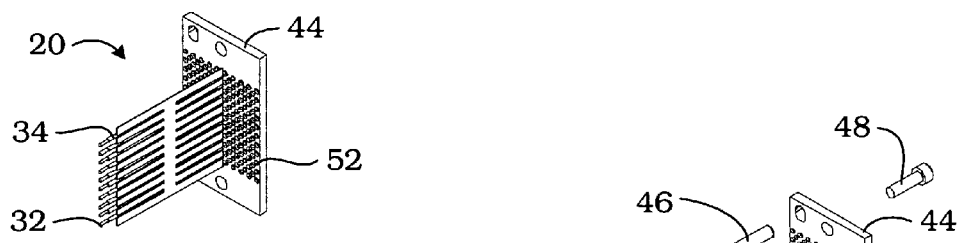
FIG. 7 is a perspective view of a probe array wafer and a retainer cap.
Figure 8:
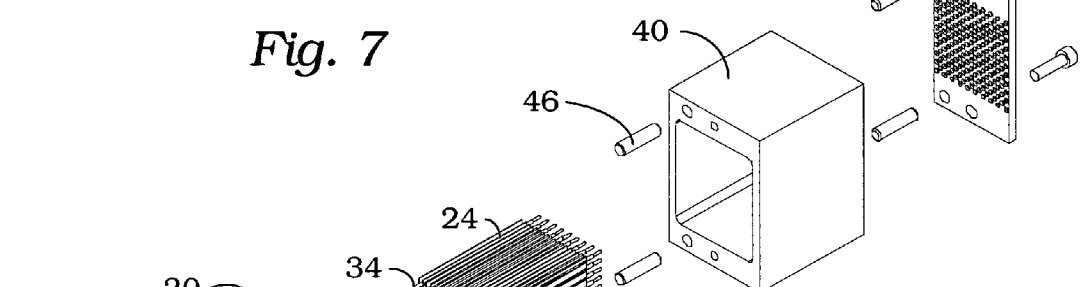
FIG. 8 is a partial exploded view of a probe array wafer and retaining block.
Figure 9:
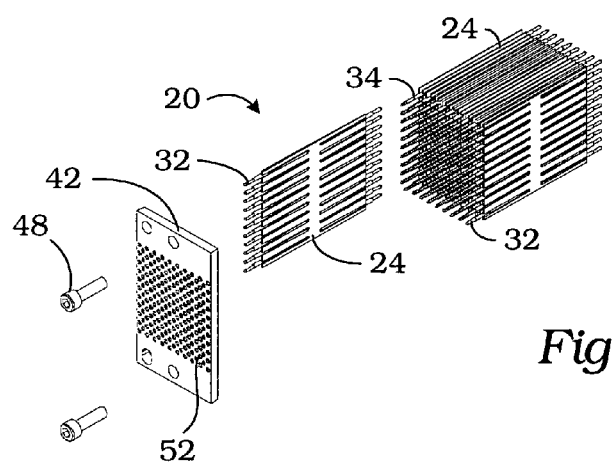
FIG. 9 is a perspective view of a plurality of probe array wafers secured in a retaining block.
Figure 9:
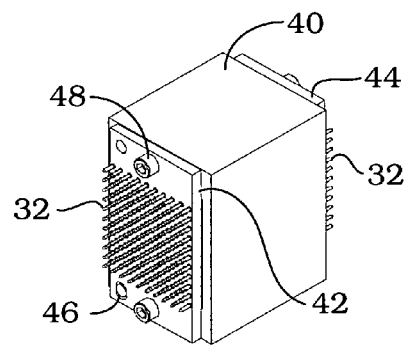

Referring to FIGS. 7-9, the probe array wafer 20 is mounted in a housing 40 and held in place by front 42 and rear 44 array caps. Alignment tabs 46 are provided along the upper and lower edges and on both sides of the housing 40 to align the array caps 42 and 44. Array caps 42 and 44 are secured to the housing 40 with fasteners 48.

Caps 42 and 44 may include alignment grooves or slots (not shown) which are adapted to receive the probe array wafers 20. Caps 42 and 44 may also include spaced-apart apertures 52 which are in axial alignment with probes 22. When the probe array wafer 20 is inserted into cap 44, for example, the plungers 32 of each of the probes 22 extend through the apertures 52 and the free ends of barrels 34 fit snugly within the apertures 52. The caps 42 and 44 keep the probe array wafers 20 aligned within the housing 40.

One, two or more blocks of probe array wafers 20 may be assembled together within housing 40 and held in place by end caps 42 and 44. The housing may then be mounted in an automatic test device for various test applications.

As illustrated in FIGS. 1-5, the substrate 24 is a single layer. However, a multi-layer substrate 66 may be used to provide other connectivity options or configurations between the probes 22. For example, using a multi-layer substrate 66, a single probe on the test equipment side may be connected to two or more probes on the DUT side of the probe array wafer 20. The multi-layer substrate 66 provides design flexibility and enhanced electrical performance.

For a multilayer substrate 66, the loop inductance may be minimized by spacing the conductive power and ground planes as close together as possible, separated by a thin insulating layer. For a power distribution system of a digital circuit, capacitive decoupling may be accomplished by utilizing one or more surface mount decoupling capacitors sized to reduce noise in the PDS and achieve signal integrity. At low frequencies, a high capacitance applied across the power source will reduce the noise. At higher frequencies, decoupling is more effective with reduced parasitic inductance rather than high capacitance by using low inductance capacitors connected in parallel to achieve the desired decoupling capacitance.

Other electronic devices 38 may be integrated on a multi-layer substrate alone with probes 22. Such electronic devices 38 may include passive components 54 such as resistors 56, capacitors 58 or inductors 60 to provide linear analog filtering, for example. Active filters 62 may be included using a combination of passive and active components such as operational amplifiers. Digital filtering may be implemented using general purpose microprocessors 64 or digital signal processors. Additional functionality may be implemented with use of microprocessors and DSPs. The electronic device 38 may be surface mounted on the substrate using manufacturing techniques known in the art.

It is to be understood that while certain forms of this invention have been illustrated and described, is it not limited thereto except insofar as such limitations are included in the following claims.

Having thus described the invention, what is claimed as new and desired to be secured by Letters Patent is:

1. An electrical probe assembly, comprising:
    a housing having open ends,
    a plurality of insulating substrates mounted in said housing,
    a plurality of compliant probes secured to each of said insulating substrates and arranged in two generally aligned rows, each of said probes having a tip extending beyond an edge of said insulating substrate,
    said tips of said plurality of compliant probes in said first row for contacting a test fixture, said tips of said plurality of compliant probes in said second row for contacting one or more devices under test, and
    a pair of end caps fastened to said open ends of said housing, each of said end caps having a plurality of apertures in axial alignment with said probe tips,
    whereas select ones of said plurality of probes in said first row are connected to select ones of said probes in said second row, and whereas said probe tips extend through said apertures of said end caps.

2. The electrical probe assembly as set forth in claim 1 wherein said plurality of probes are compliant spring probes.

3. The electrical probe assembly as set forth in claim 1 wherein said plurality of probes are compliant bent metal probes.

4. The electrical probe assembly as set forth in claim 1 wherein said each of said plurality of insulating substrates includes a plurality of spaced apart grooves each adapted to receive one of said compliant probes.

5. The electrical probe assembly as set forth in claim 1 wherein each of said insulating substrates includes one or more conducting layers.

6. The electrical probe assembly as set forth in claim 1 further comprising a passive electronic filter mounted to said substrate and in communication between one or more probes in said first row and one or more probes in said second row.

7. The electrical probe assembly as set forth in claim 1 further comprising an active electronic filter mounted to said substrate and in communication between one or more probes in said first row and one or more probes in said second row.

8. The electrical probe assembly as set forth in claim 1 further comprising a microprocessor mounted to said substrate and in communication between one or more probes of said first row and one or more probes of said second row.

9. The electrical probe assembly as set forth in claim 1 further comprising active and passive electronic components mounted to said substrate and in communication between one or more probes of said first row and one or more probes of said second row.

10. An electrical probe assembly comprising:
    an insulating substrate;
    a plurality of compliant probes secured to said insulating substrate and arranged in two generally aligned rows, each of said probes having a tip extending beyond an edge of said insulating substrate;
    said tips of said plurality of compliant probes in said first row for contacting a test fixture, said tips of said plurality of compliant probes in said second row for contacting one or more devices under test,
    whereas select ones of said plurality of probes in said first row are connected to select ones of said probes in said second row;
    a housing adapted to receive and secure a plurality of said substrates in an aligned and spaced apart relationship; and
    a pair of end caps fastened to said housing, each of said end caps having a plurality of spaced apart apertures axially aligned with said plurality of compliant probes extending from said substrates, said apertures adapted to receive said compliant probe tips therethrough.

11. The electrical probe assembly as set forth in claim 10 wherein said plurality of probes are compliant spring probes.

12. The electrical probe assembly as set forth in claim 10 wherein said plurality of probes are compliant bent metal probes.

13. The electrical probe assembly as set forth in claim 10 wherein said insulating substrate includes a plurality of spaced apart grooves each adapted to receive one of said compliant probes.

14. The electrical probe assembly as set forth in claim 10 wherein said insulating substrate includes two or more conducting layers.

15. The electrical probe assembly as set forth in claim 10 further comprising a passive electronic filter mounted to said substrate and in communication between one or more probes in said first row and one or more probes in said second row.

16. The electrical probe assembly as set forth in claim 10 further comprising an active electronic filter mounted to said substrate and in communication between one or more probes in said first row and one or more probes in said second row.

17. The electrical probe assembly as set forth in claim 10 further comprising a microprocessor mounted to said substrate and in communication between one or more probes of said first row and one or more probes of said second row.

18. The electrical probe assembly as set forth in claim 10 further comprising active and passive electronic components mounted to said substrate and in communication between one or more probes of said first row and one or more probes of said second row.

* * * * *